(12) United States Patent
Hsu

(10) Patent No.: US 6,417,787 B1
(45) Date of Patent: Jul. 9, 2002

(54) METHOD AND APPARATUS FOR INCREASING THE NUMBER OF KEYS OF A KEY-MATRIX

(75) Inventor: Jerry Shih-Pin Hsu, Tainan (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/379,911

(22) Filed: Aug. 24, 1999

(51) Int. Cl.[7] .............................................. H03M 11/00
(52) U.S. Cl. ............................ 341/26; 341/22; 341/24; 341/25
(58) Field of Search .............................. 341/26, 21, 22, 341/24, 25

(56) References Cited

U.S. PATENT DOCUMENTS

| | | | |
|---|---|---|---|
| 4,918,444 A | * | 4/1990 | Matsubayashi ............... 341/25 |
| 4,922,248 A | * | 5/1990 | Shiga ............................ 341/24 |
| 5,151,554 A | * | 9/1992 | Matsuda ....................... 340/2.4 |
| 5,463,386 A | * | 10/1995 | Wu ............................... 341/22 |
| 5,554,985 A | * | 9/1996 | Chang .......................... 341/22 |

\* cited by examiner

*Primary Examiner*—Michael Horabik
*Assistant Examiner*—Hung Dang

(57) ABSTRACT

An apparatus and a method for increasing the number of keys in a ready made key-matrix, it is necessary to increase some extra diodes and change the keyboard scanning method. To increase some extra keys in the key-matrix, the diodes are in series with the keys, and the keyboard scanning method is executed by detecting the conductive direction of the diodes. The method avoids redesigning any IC to increase I/O ports, therefore, it can save the cost of redesigning and advance the sale.

9 Claims, 4 Drawing Sheets

METHOD AND APPARATUS FOR INCREASING THE NUMBER OF KEYS OF A KEY-MATRIX

BACKGROUND OF THE INVENTION

1. Field of the Invention

The present invention relates to an apparatus and a method for increasing the number of keys in the key-matrix, and more particularly to an improved key-matrix.

2. Description of the Prior Art

For a typical ready made key-matrix, it is difficult to increase the number of keys in the unchanged original IC design. For example, as illustrated in FIG. 1, it shows a 4×matrix of electronic keyboard, wherein the scanning circuit 10 uses seven I/O ports (R1–R4, C1–C3) and the key-matrix merely can provides 12 keys at most. Therefore, if more keys are needed, it is necessary to redesign one IC to increase I/O pins for increasing the number of keys. Such method not only increases the cost but also delays the time to market. Currently, there are some methods for increasing the number of keys by a power line and a ground line, for example, U.S. Pat. No 5,463,386 entitled "Electrical matrix keyboard scanning circuit" by Wu Chyi-Chang and U.S. Pat. No. 5,554,985 entitled "Method for scanning keypad architecture employing power source and ground of digital electronic devices". As illustrated in FIG. 2, it shows a original 4×matrix of electronic keyboard with 12 keys as shown in FIG. 1 being expanding and increasing to be 19 keys ((4+1)×(3+1)−1) by utilizing the method of Wu. The method can increase the number of keys under the condition of unchanging ready made the number of I/O ports. However, when the designed IC which have been adopted with the prior art is required to increase some keys to execute some extra functions, the original IC has used all of the keys or the IC requirement exceeds the reserve number of keys, and the original key-matrix can not accommodate more keys. Therefore, the only way for redesigning one IC is to increase I/O ports to execute extra functions. However, if we only need few number of keys to execute some extra functions, the above method for redesigning one IC will waste money and delay the time to market. In accordance with the above description, to avoid increasing the cost for redesigning one IC and delaying the sale, the key-matrix can increase some keys in a un-changing original key-matrix design just by increasing some extra diodes in the key-matrix and changing the scanning method in the scanning circuit.

As illustrated in FIG. 1, the scanning method of electronic keyboard has two types, one is positive logic and the other is negative logic. In the state of negative logic, first, the key-matrix scans rows and it sets rows (R1–R4) with high resistance and high voltage, and it sets columns (C1–C3) with low resistance and low voltage. Then if a key in rows (R1–R4) is pressed, one of the row ports (R1–R4) will be detected the low voltage, and the voltage data will be latched by the latch circuit, then the key-matrix stores the state of row ports (R1–R4) into the memory structure (QR1–QR4) in the scanning circuit 10. Then, the key-matrix changes the scanning method for scanning columns, and it sets columns (C1–C3) with high resistance and high voltage, and it sets rows (R1–R4) with low resistance and low voltage. At this time, one of the column ports (C1–C3) will be detected in low voltage, and the voltage data will be latched by the latch circuit, then the key-matrix stores the state of the column ports (C1–C3) into the memory structure (QC1–QC3) in the scanning circuit 10. Accordingly, the location of pressed key can be determined correctly by the memories structure (QR1–QR4 and QC1–QC3).

As illustrated in FIG. 2 again, it is a scanning method of electronic keyboard with a power line and a ground line for inputting. In the state of negative logic, first, the key-matrix scans rows and sets rows (R1–R4) with high resistance and high voltage, and it sets columns (C1–C3) with low resistance and low voltage. Then if a key is pressed in rows (R1–R4), one of the row ports (R1–R4) will be detected at the low voltage. However, if a key in the power line is pressed, one of the column ports (C1–C3) will be detected with a high voltage, and row ports (R1–R4) will maintain at the initial high voltage. According to the stated above, the key-matrix checks the voltage state of row ports and column ports to determine whether there is any key to be pressed, and then the key-matrix stores the voltage state of row ports (R1–R4) into the memory structure (QR1–QR4) in the scanning circuit 20. Additionally, if a key in the power line is pressed, the key-matrix also stores the voltage state of column ports (C1–C3) into the memory structure (QC1–QC3) in the scanning circuit 20. Then, the key-matrix changes the scanning method for scanning columns and it sets columns (C1–C3) with high resistance and high voltage, and it sets rows (R1–R4) with low resistance and low voltage. Then if a key in columns (C1–C3) is pressed, one of the column ports (C1–C3) will be detected with low voltage. Then, the key-matrix stores the voltage state of column ports (C1–C3) into the memory structure (QC1–QC3) in the scanning circuit 20. However, if a key in the ground line is pressed, the column ports (C1–C3) will maintain at initial high voltage. Additionally, if the key-matrix has detected a key in the power line being pressed by previous row scanning, the key-matrix will not store the current voltage state of column ports (C1–C3) into the memory structure (QC1–QC3) in the scanning circuit 20 after columns scanning, and it will still maintain the previous state value of the memory structure (QC1–QC3) before columns scanning. Accordingly, the location of pressed key can be determined correctly by the memory structure (QR1-QR4 and QC1–QC3).

As illustrated in FIG. 3A and FIG. 3B, they show the conventional scanning method. When a key is pressed, the row port and the column port are short. For example, the circuit sets the row port with high resistance and high voltage, and it sets the column port with low resistance and low voltage. When a key is pressed, the row port will be pulled down to a low voltage. However, if there is not any key to be pressed, the row port and the column port will be unchanged in voltage. By this way, the detected circuit can determine whether any key should be pressed. In general, when the key-matrix scans, the scanning method is "bi-direction detecting". In other word, when a switch between a row and a column is pressed, the voltage data of a row or a column will be changed, and the key-matrix can only used to determine whether any key be pressed according to the change of the voltage data in a row or a column. The theorem can just beused to determine whether the key is conductive between a row and a column. And the conductive direction will not beconfirmed. Therefore, if the scanning method for bi-dircetion can be changed to the method for uni-direction, the same dectected circuit can increase some keys.

SUMMARY OF THE INVENTION

It is an object of present invention to provide an improved key-matrix apparatus which is particularly suitable for the unchanged original key-matrix to increase some rooms for extra function keys.

It is another object of present invention to provide a method for increasing some keys, wherein the method is that diodes are in series with keys being detected by different conductive direction, and the method can save the cost of redesigning and advance the sale.

In accordance with the above-stated, the present invention provides an apparatus and a method for increasing keys in the ready-made key-matrix. The method is that setting diodes being in series with keys in the key-matrix and detecting whether the key is pressed in the circuit by detecting whether the diodes are conductive. By this way, the ready-made key-matrix can rapidly increase some keys. In general, in the uni-direction detecting circuit, a diode merely can determine one key by detecting diode conductivity in uni-direction. Therefore, when diodes are detected by different conductive directions such as bi-direction (forward-direction and reversed-direction), the circuit can detect more keys, wherein the diodes are in series with keys and the diodes have different conductive directions. By this method, the present invention can change a non-directional key switch (bi-direction conductivity) into a directional key switch (bi-direction conductivity) to increase the number of keys in the ready-made key-matrix. For example, the original keyboard with M×N keys will expand to 2×M×N or 3×M×N keys. However, it is necessary to increase some extra diodes in the circuit, and the cost will become very expensive. Therefore, the present invention is particularly suited for increasing a little extra function keys in the ready-made key-matrix.

DESCRIPTION OF THE PREFERRED EMBODIMENT

Figure 1:
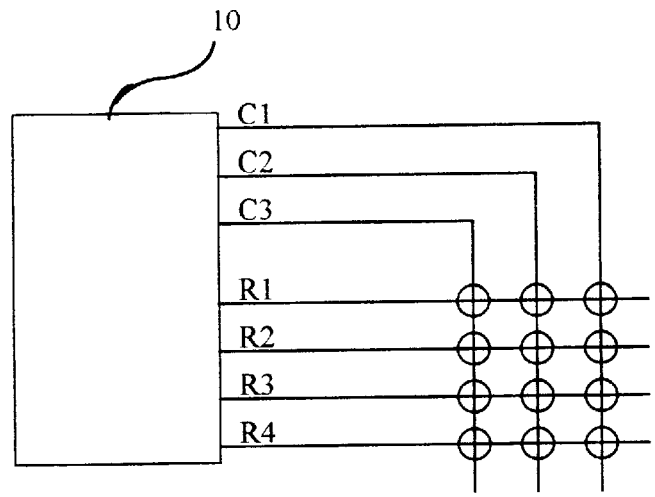
FIG. 1 shows a conventional key-matrix apparatus.
Figure 2:
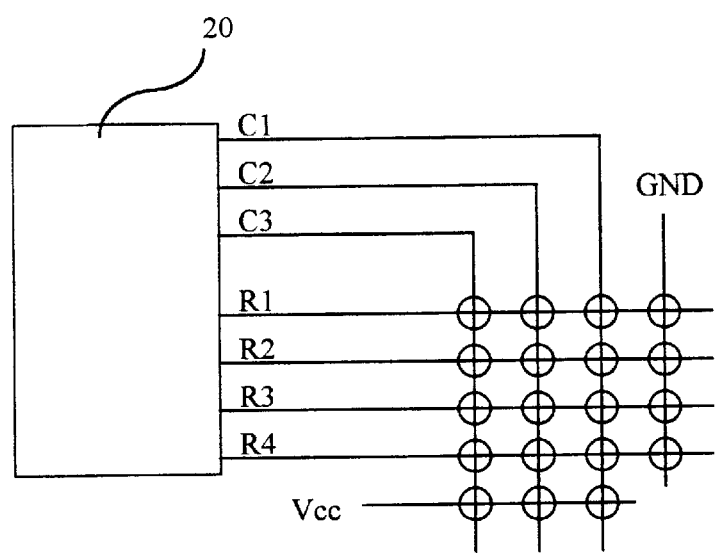
FIG. 2 shows a conventional key-matrix apparatus with power line and ground line.
Figure 3A:
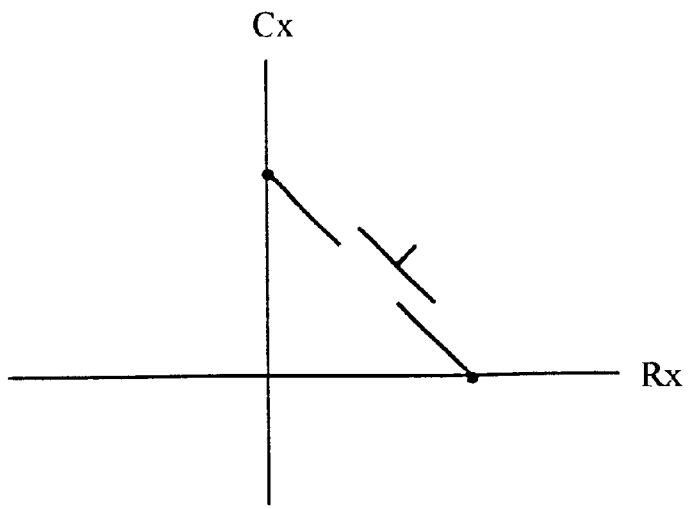
FIG. 3A, FIG. 3B show the conventional key switches.
Figure 3B:
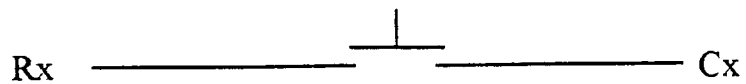
Figure 4A:
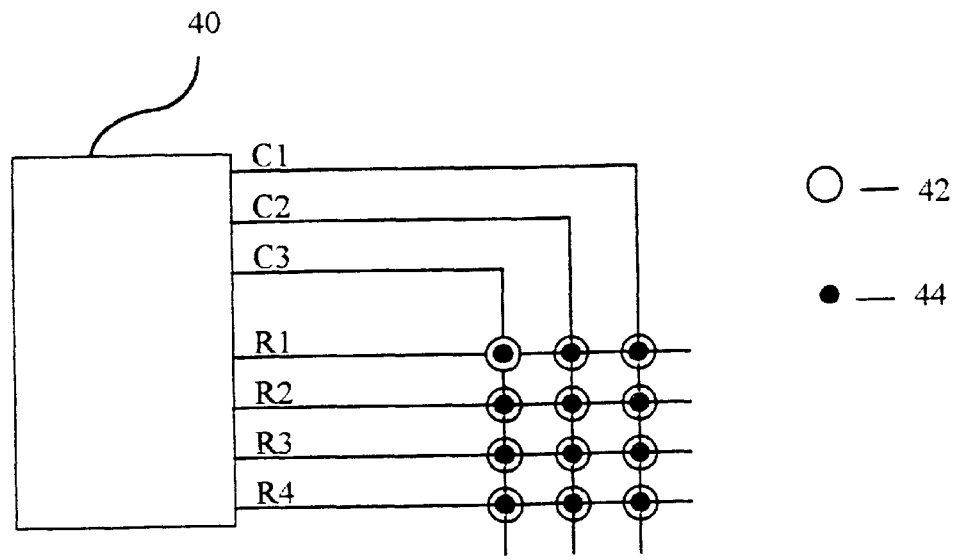
FIG. 4A shows the key-matrix apparatus according to the present invention by detecting forward direction or reversed direction.
Figure 4B:
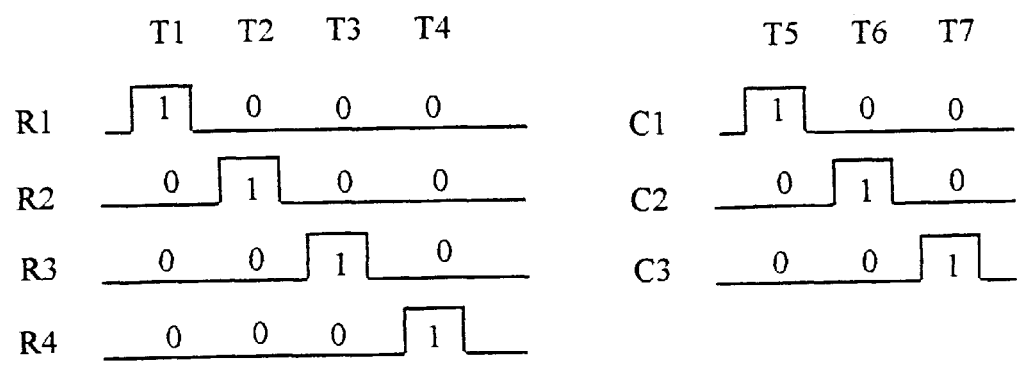
FIG. 4B shows the timing pulse according to the present invention by detecting forward direction or reversed direction.

As illustrated in FIG. 4A, a scan circuit 40 has seven I/O ports (R1,R2,R,R4) and (C1,C2,C3). As illustrated in FIG. 4B, a timing generator produces the controlling timing signal. When the timing pulse T1, the output ports (R1,R2,R3,R4) are (1,0,0,0). Then, the key-matrix is determined whether any keys 42 of a row R1 is pressed from detecting the input ports (C1,C2,C3). The method is the forward direction detecting. When the timing pulse T2, the output ports (R1,R2,R3,R4) are (0,1,0,0). When the timing pulse T3, the output ports (R1,R2,R3,R4) are (0,0,0,1). When the timing pulse T4, the output ports (R1,R2,R3,R4) are (0,0,0,1). The scanning method is the same the forward direction detecting as the method in T1 by detecting the input ports (C1,C2,C3), and the key-matrix is detected sequentially whether any keys 42 in rows (R2–R4) is pressed. However, when the timing pulse in T5, the output ports (C1,C2,C3) are (1,0,0). Then, the key-matrix is determined whether any keys 44 in a column C1 is pressed from detecting the input ports (R1,R2,R3,R4). The method hereof is the reversed direction detecting. When the timing pulse T6, the output ports (C1,C2,C3) are (0,1,0). When the timing pulse T7, the output ports (C1,C2,C3) are (0,0,1). The method is the same as the reverse direction detecting method used in T5 from the input ports (R1,R2,R3,R4), and the key-matrix is detected sequentially whether any keys 44 in columns (C2,C3) is pressed. In accordance with the above-stated, between any two I/O ports (R×,C×), a plurality of keys can be detected by uni-direction (forward direction or reverse direction) detecting, rather than just detecting one key from the bi-direction detecting. Therefore, the key-matrix can increase some keys by software to set the voltage of rows and columns and by changing inter scanning method (bi-direction detecting changes into uni-direction (forward direction or reverse direction) detecting)

Figure 5:
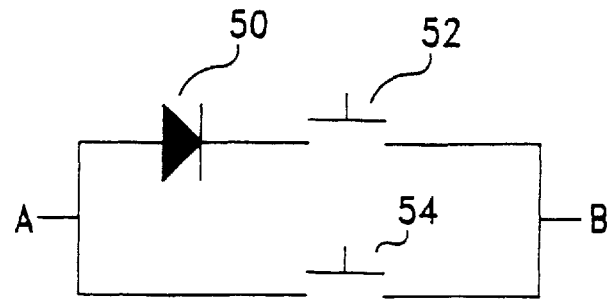
FIG. 5 shows an apparatus of one preferred embodiment according to the present invention by detecting uni-direction or bi-direction.

In order to explain conveniently, taking two I/O ports for instance. As illustrated in FIG. 5, it shows the first preferred embodiment according to the present invention. A diode 50 and a key 52, wherein the diode 50 is in series with the key 52, are coupled with two I/O ports (A,B). A key 54 is coupled with the same two I/O ports (A,B). In the normal state, first, the key-matrix sets port A with low resistance and high voltage, and it sets port B with high resistance and low voltage. When a key is pressed, the key-matrix detects the voltage of port B, and it stores the state of port B into the memory structure QB. If the voltage of port B is at high voltage, the circuit is conductive and logic is "1". Otherwise, if the voltage of port B is still at low voltage, the circuit is not conductive and logic is "0". Then, the scanning method is changed, and the port B is set with low resistance and high voltage, and the port A is set with high resistance and low voltage. Then, the key-matrix detects the voltage of port A, and the key-matrix stores the state of port A into the memory structure QA. Therefore, the location of the pressed key can be determined from the memory structure (QA and QB). Namely, the circuit with two I/O ports in the key-matrix is detected by the method of detecting uni-direction or bi-direction conductivity to determine the location of the pressed key.

Figure 6:
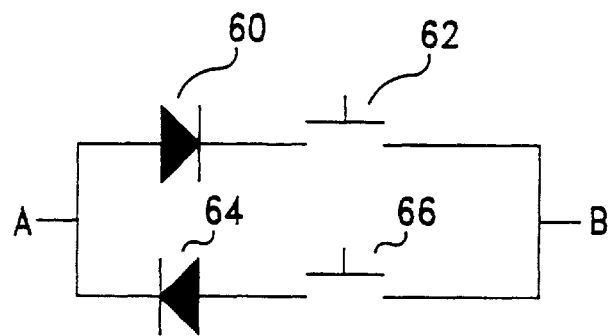
FIG. 6 shows an apparatus of another preferred embodiment according to the present invention by detecting forward direction or reversed direction.

As illustrated in FIG. 6, it shows the second preferred embodiment according to the present invention. A forward-direction diode 60 and a key 62, wherein the diode 60 is in series with the key 62, and coupled with two I/O ports (A,B). A reversed-direction diode 64 and a key 66, wherein the diode 64 is in series with the key 66, and both are coupled with the same two I/O ports (A,B). The scanning method is the same as stated above in the first preferred embodiment according to the present invention. The location of the pressed key can be determined from the memory structure (A,B), namely, the circuit with two I/O ports in the key-matrix is detected by the method of detecting forward-direction or reversed-direction conductivity to determine the location of the pressed key.

Figure 7:
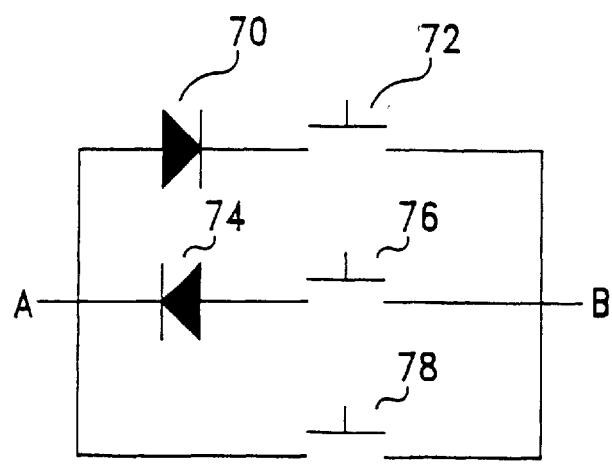
FIG. 7 shows an apparatus of still another preferred embodiment according to the present invention by detecting forward direction or reversed direction or bi-direction.

As illustrated in FIG. 7, it shows the third preferred embodiment according to the present invention. A forward-direction diode 70 and a key 72, where the diode 70 is in series with the key 72, and coupled with two I/O ports (A,B). A reversed-direction diode 74 and a key 76, wherein the diode 74 is in series with the key 76, and coupled with the same two I/O ports (A,B), and a key 78 is coupled with the same two I/O ports (A,B). The scanning method is the same as stated above in the first preferred embodiment according to the present invention. The location of the pressed key is determined from the memory (QA,QB), namely, the circuit with two I/O ports in the key-matrix is detected by the method of detecting forward-direction or reversed-direction or bi-direction conductivity to determine the location of the pressed key.

In a ready-made key-matrix apparatus, when the key-matrix needs to increase some extra function keys in the state of the unchanged original design (I/O port), it is necessary to increase some different conductive direction diodes and change the scanning method, namely, the key-matrix detects different conductive direction in the circuit and increases the rooms on the original keyboard for extra functional keys. The method avoids redesigning any IC to increase I/O ports, therefore, it can save the cost and advance the sale.

In accordance with the above-stated, the persent invention is preferable to the ready-made key-matrix to increase some extra function keys. Therefore, if the key-matrix merely adopt hardware structure to scan the circuit, it is not suited for the method of the present invention, and the method will do except that it is considered in the initial IC design. Generally speaking, a chip IC is often controled by the program written by the mircroprocessor. For this application, the scanning method in the key-matrix can be changed by software to correct the initial program. Additionally, if the IC are the Mask ROMs, they are only corrected by a single mask layer to increase keys in the key-matrix. However, if the IC are the Erasable PROMs or OTP ROMs, they are merely irradiated with ultraviolet (UV) light for erasing and programed again. Therefore, the present invention can save the cost and advance the sale.

Although specific embodiments have been illustrated and described, it will be obvious to those skilled in the art that various modification may be made without departing from the spirit which is intended to be limited solely by the appended claims.

What is claimed is:

1. Key-matrix apparatus for increasing the number of keys between two I/O ports, comprising:
   a first diode for detecting the forward-direction conductivity;
   a first key means, for inputting signal of a key-matrix, being in series with said first diode, and said first diode and said first key means are coupled with the two I/O ports;
   a second diode for detecting the reversed-direction conductivity, having different conductive direction with said first diode; and
   a second key means, for inputting signal of the key-matrix being in series with said second diode, and said second diode and said second key means are coupled with the two I/O ports.

2. The apparatus according to claim 1, wherein said first key means is pressed when the forward-direction conductivity is detected through said first diode, and said second key means is pressed when the reversed-direction conductivity is detected through said second diode.

3. Key-matrix apparatus for increasing the number of keys between two I/O ports, comprising:
   a diode for detecting the uni-direction conductivity;
   a first key means, for inputting signal of a key-matrix, being in series with said diode, wherein said diode and said first key means are coupled with the two I/O ports; and
   a second key means, for inputting signal of the key-matrix and detecting the bi-direction conductivity, being coupled with the two I/O ports.

4. The apparatus according to claim 3, wherein said first key means is pressed when the uni-direction conductivity is detected by said diode, and said second key means is pressed when the bi-direction conductivity is detected.

5. Key-matrix apparatus for increasing the number of keys between two I/O ports, comprising:
   a first diode for detecting the forward-direction conductivity;
   a first key means for inputting signal of a key-matrix being in series with said first diode, and said first diode and said first key means are coupled with the two I/O ports;
   a second diode for detecting the reversed-direction conductivity having different conductive direction with said first diode;
   a second key means for inputting signal of the key-matrix being in series with the second diode, and said second diode and said second key means are coupled with said two I/O ports; and
   a third key means for inputting signal of the key-matrix and detecting the bi-direction conductivity being coupled with the two I/O ports.

6. The apparatus according to claim 5, wherein said first key means is asserted when the forward-direction conductivity is detected by said first diode, and said second key means is asserted when the reversed-direction conductivity is detected by said second diode, and said third key means is asserted when the bi-direction conductivity is detected.

7. A key-matrix scanning method for increasing the number of keys between two I/O ports, comprising the steps of:
   connecting a forward-direction diode to a first key means in a series configuration;
   coupling said forward-direction diode and said first key means with the two I/O ports;
   connecting a reversed-direction diode to a second key means in a series configuration;
   coupling said reversed-direction diode and said second key means with the two I/O ports; and
   detecting a direction of conductivity between the two I/O ports, and said first key means is asserted when the forward-direction conductivity is detected by said forward-direction diode, and said second key means is asserted when the reversed-direction conductivity is detected by said reversed-direction diode.

8. A key-matrix scanning method for increasing the number of keys between two I/O ports, comprising the steps of:
   connecting a diode to a first key means in a series configuration;
   coupling said diode and said first key means with the two I/O ports;
   coupling a second key means with the two I/O ports; and
   detecting a direction of conductivity between the two I/O ports, and said first key means is asserted when the uni-direction conductivity is detected by said diode, and said second key means is asserted when the bi-direction conductivity is detected.

9. A keyboard scanning method for increasing the number of keys between two I/O ports, comprising the steps of:
   connecting a forward-direction diode to a first key means in a series configuration;
   coupling said forward-direction diode and said first key means with the two I/O ports;

connecting a reversed-direction diode to a second key means in a series configuration;

coupling said reversed-direction diode and said second key means with the two I/O ports;

coupling a third key means with the two I/O ports; and detecting a direction of conductivity between the two I/O ports, and said first key means is asserted when the forward-direction conductivity is detected by said forward-direction diode, and said second key means is asserted when the reversed-direction conductivity is detected by said reversed-direction diode, and said third key means is asserted when the bi-direction conductivity is detected.

* * * * *